United States Patent [19]

Sichmann et al.

[11] Patent Number: 5,006,213
[45] Date of Patent: Apr. 9, 1991

[54] PROCESS FOR COATING A SUBSTRATE WITH ELECTRICALLY CONDUCTIVE MATERIALS

[75] Inventors: Eggo Sichmann, Gelnhausen; Thomas Krug, Hanau; Stephan Kempf, Alzenau, all of Fed. Rep. of Germany

[73] Assignee: Leybold Aktiengesellschaft, Hanau I, Fed. Rep. of Germany

[21] Appl. No.: 401,050

[22] Filed: Aug. 31, 1989

[30] Foreign Application Priority Data

Jun. 12, 1989 [DE] Fed. Rep. of Germany ....... 3919145

[51] Int. Cl.$^5$ .............................................. C23C 14/34
[52] U.S. Cl. ........................... 204/192.14; 204/192.15
[58] Field of Search ....................... 204/298.07, 298.08, 204/298.09, 298.11, 192.14, 192.15, 192.22, 192.26

[56] References Cited

U.S. PATENT DOCUMENTS

| | | | |
|---|---|---|---|
| 4,322,276 | 3/1982 | Meckel et al. | 204/192.22 X |
| 4,413,877 | 11/1983 | Suzuki et al. | 204/192.26 X |
| 4,572,842 | 2/1986 | Dietrich et al. | 204/298 GF |

Primary Examiner—Nam X. Nguyen
Attorney, Agent, or Firm—Felfe & Lynch

[57] ABSTRACT

A DC source 10 is connected to an electrode 5 disposed in a coating chamber 15a which can be evacuated and this electrode is electrically connected to an aluminum target 3 which is sputtered by introduction of a process gas and the sputtered particles deposited onto a plastic substrate. During the coating process hydrogen and/or water vapor are supplied to the cathode area from a container 32 via a system of pipes 30 to increase the adhesive strength of the sputtered layer 2 on the substrate 1.

4 Claims, 2 Drawing Sheets

PROCESS FOR COATING A SUBSTRATE WITH ELECTRICALLY CONDUCTIVE MATERIALS

BACKGROUND OF THE INVENTION

The invention relates to a process for coating a substrate with electrically conductive materials, preferably aluminum, including a direct current source which is connected to an electrode disposed in a coating chamber which can be evacuated. The electrode is electrically connected to the target to be sputtered and the sputtered particles of which are deposited on the substrate, for example, a part made of a plastic material, and in this process, a process gas can be introduced into the coating chamber. The invention also comprises a device for the working of this process.

In known processes an aluminum layer is directly sputtered onto the plastic substrate, e.g. polycarbonate, without an intermediate or adhesive layer.

This process has the disadvantage of limiting adhesive strength of the aluminum to a great extent. It turned out that when the coated substrates were further processed the layer peeled off.

SUMMARY OF THE INVENTION

Hence, it is an object of the present invention to provide a process and a device which significantly improve the adhesive strength of a sputtered aluminum layer on a plastic substrate so that present conventional devices and systems are not rendered unfit for this purpose and so that no fundamental technical reassembling or change which involves a high amount of labor and cost becomes necessary. Also, present operational safety standards must not be adversely affected.

During the coating hydrogen and/or water vapor can be introduced into the cathode area via a pipe system and 1/5 of the sputtering pressure is generated by the introduced hydrogen or water vapor. Preferably, a device is used which includes a container filled with water vapor or hydrogen and which includes a feed line connecting this container to the coating chamber. A valve is incorporated in this feed line for measuring a determined amount of water vapor or hydrogen to be supplied to the coating chamber.

DETAILED DESCRIPTION OF THE PREFERRED EMBODIMENT

Figure 1:
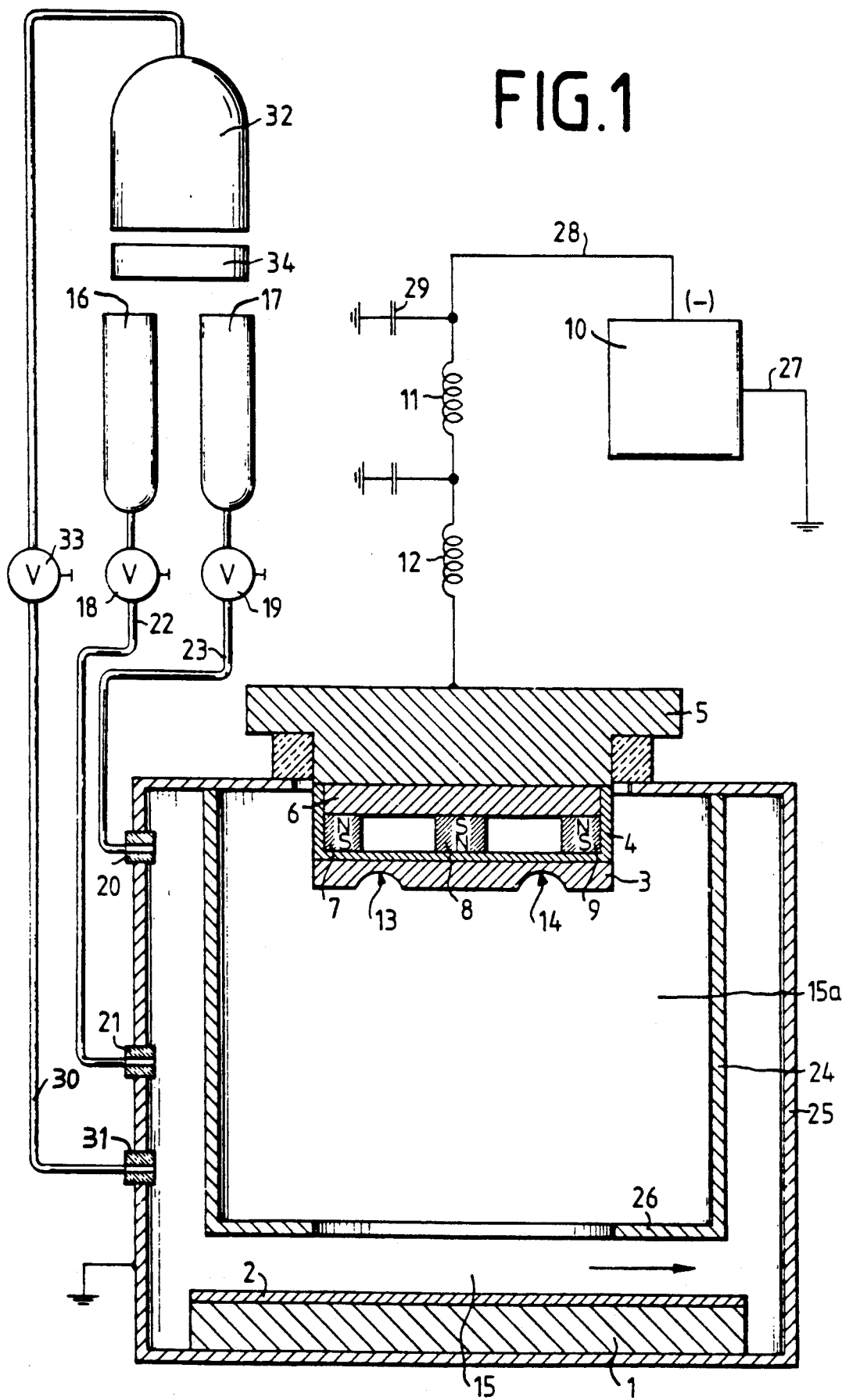
FIG. 1 is a diagrammatic side section view of a sputtering device for DC-sputtering and FIG. 2 is a chart showing how the cathode current is a function of the cathode voltage and the sputtering rate over the sputtering yield in a sputtering power of the kind in question.

The drawing shows a substrate 1 which is to be provided with a thin metal layer 2. A target 3 to be sputtered is placed opposite the substrate 1. Via element 4 which has a U-shaped cross section, the target 3 is connected to an electrode 5 which rests on a yoke 6. Three permanent magnets 7, 8, 9 are enclosed between this yoke 6 and the element 4. The polarities of the poles of the three permanent magnets 7, 8, 9 are directed toward the target 3 and alternate such that together with the north pole of the center permanent magnet 8 the south poles of the two external permanent magnets, respectively, generate an approximately circular arc-like magnetic field through the target 3. This magnetic field condenses the plasma before the target 3 such that it reaches its highest density where the magnetic fields are at the maximum of their circular arc. The ions in the plasma are accelerated by an electric field which is generated because of a constant voltage which is produced by a DC-source 10. With its negative pole, this DC source 10 is connected via two inductive resistors 11, 12 to the electrode 5. The electric field is vertical on the surface of the target 3 and accelerates the positive ions of the plasma in direction toward this target. A more or less great number of atoms or particles are thus knocked out of the target 3, particularly out of the areas 13, 14, where the horizontal component of the magnetic field has its maximum. The sputtered atoms or particles travel in direction toward the substrate 1 where they are deposited as a thin layer 2.

In a chamber 15, the metal particles which are knocked out of the target 3 react with certain gases on the substrate surface. These gases are supplied into chamber 15 from gas cylinders 16, 17, via gas supply lines 22, 23 and through valves 18, 19 and inlets 20, 21. The chamber is formed by two containers 24, 25 of which the container 25 also surrounds the substrate 1 whereas the other container 24 ends in front of the substrate 1 and forms a diaphragm 26. Both containers 24, 25 and, hence, the substrate 1 which rests on the bottom of the container 25 are electrically grounded. The second connection 27 of the DC source 10 is also grounded while the first connection 28 is connected to a grounded capacitor 29 in addition to the conductive resistors 11, 12.

This arrangement permits the gas to enter the interspace between the first and the second container 25, 24; however, it could also be supplied to the second container 24 via a gas distributing system surrounding the cathode 5.

For controlling the arrangement as represented a process control computer can be used which computes the measured data and supplies control commands. The values of the partial pressure which was measured can, for example, be fed to this process control computer in the process chamber 25. Based on this and other data, the computer can control the gas flow via valves 18, 19 and adjust the voltage at the cathode. The process control computer is also capable of controlling all other variables, for example, cathode current and magnetic field strength. Since process control computers of this kind are known, the design description thereof can be omitted.

Figure 2:
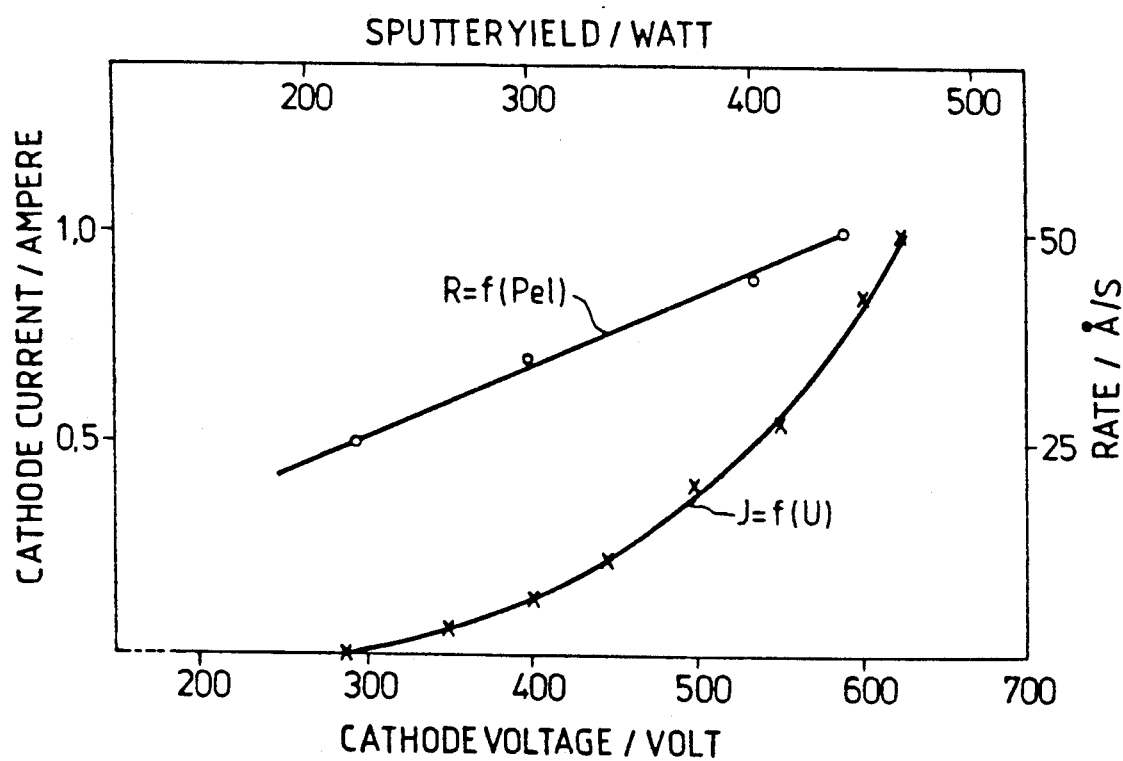

FIG. 2 is a graphic illustration of the different operational processes included in DC magnetron sputtering. From the drawing which is based on a pure argon atmosphere of argon and a gas pressure of $7 \times 10^{-3}$ mbar/$5.3 \times 10^{-3}$ Torr), it can be gathered that the direct current of the cathode is a clear function of the DC cathode voltage; this also applies the reverse way. Since the resistance decreases when the voltage increases, a fact which is caused by the formation of a conductive plasma, the current $J = f(U)$ increases approximately parabolically. The sputtering rate R, which is expressed in Å/sec rises linearly with an increasing sputtering power. This is expressed through the straight line $R = f(Pel)$. At 440 watts, which corresponds to a power density of 10 watts/cm$^2$, the rate amounts to 50 Å/sec.

As it can be seen in FIG. 1, the feed line 30 including the inlet 31 is provided in addition to gas supply lines 22, 23. This line connects the container 32 to the chamber 15 and a valve 33 is incorporated in the line 30.

In order to improve the adhesive strength of the layer 2 on the substrate (a small amount) of water vapor can be introduced into the chamber 15 from the container 32, particularly before the sputtering process starts. This water vapor is generated in container 32 which is heated by a heater 34.

Hydrogen gas can also be used instead of water vapor which further increases the adhesive strength; however, this requires special caution during operation of the system since leakages can create a certain explosion hazard. Whether water vapor or hydrogen gas is used, it generates one fifth of the sputtering pressure. The partial pressure of the additional gas is thus $1.4 \times 10^{-3}$ mbar.

LISTING OF PARTS 1 substrate
2 layer
3 target
4 U-shaped element
5 electrode
6 yoke
7 permanent magnet
8 permanent magnet
9 permanent magnet
10 DC source
11 inductive resistor
12 inductive resistor
13 sputtering gap (area)
14 sputtering gap (area)
15, 15a chamber, coating chamber
16 gas cylinder
17 gas cylinder
18 valve
19 valve
20 inlet
21 inlet
22 gas supply line
23 gas supply line
24 container
25 container, process chamber
26 diaphragm
27 electric connection (grounding cable)
28 electric connection
29 capacitor
30 feed line
31 inlet piece
32 container
33 valve
34 heater

We claim:

1. Process for coating a plastic substrate with electrically conductive material, comprising the steps of
   providing an electrode in a coating chamber which can be evacuated, said electrode being connected to D.C. power source;
   providing a target of the material to be coated in said chamber, said target being connected to said electrode;
   disposing a plastic substrate in said chamber opposite said target;
   introducing a process gas in said coating chamber;
   introducing into said chamber at least one additional gas selected from the group consisting of hydrogen and water vapor so that the sputtering pressure is $7 \times 10^{-3}$ mbar and the partial pressure of the additional gas is $1.40 \times 10^{-3}$ mbar; and
   sputtering said target to deposit said material on said substrate.

2. Process as in claim 1 wherein said target is aluminum.

3. Process as in claim 1 wherein said process gas is an inert gas.

4. Process as in claim 3 wherein said process gas is argon.

* * * * *

UNITED STATES PATENT AND TRADEMARK OFFICE
CERTIFICATE OF CORRECTION

PATENT NO. : 5,006,213
DATED : April 9, 1991
INVENTOR(S) : Sichmann et al.

It is certified that error appears in the above-identified patent and that said Letters Patent is hereby corrected as shown below:

Column 2, line 55, delete "mbar/$5.3 \times 10^{-3}$ Torr)" and insert --mbar ($5.3 \times 10^{-3}$ Torr)--.

Signed and Sealed this

Twenty-second Day of June, 1993

Attest:

MICHAEL K. KIRK

Attesting Officer     Acting Commissioner of Patents and Trademarks